United States Patent
Umeda

(10) Patent No.: US 9,018,953 B2
(45) Date of Patent: Apr. 28, 2015

(54) MAGNETIC RESONANCE IMAGING APPARATUS AND MAGNETIC RESONANCE IMAGING METHOD

(71) Applicants: Kabushiki Kaisha Toshiba, Tokyo (JP); Toshiba Medical Systems Corporation, Otawara-shi, Tochigi (JP)

(72) Inventor: Masaaki Umeda, Sakura (JP)

(73) Assignees: Kabushiki Kaisha Toshiba, Tokyo (JP); Toshiba Medical Systems Corporation, Otawara-shi, Tochigi (JP)

( * ) Notice: Subject to any disclaimer, the term of this patent is extended or adjusted under 35 U.S.C. 154(b) by 0 days.

(21) Appl. No.: 14/022,670

(22) Filed: Sep. 10, 2013

(65) Prior Publication Data

US 2014/0009157 A1   Jan. 9, 2014

Related U.S. Application Data

(63) Continuation of application No. PCT/JP2012/069920, filed on Aug. 3, 2012.

(30) Foreign Application Priority Data

Sep. 22, 2011   (JP) .................................. 2011-208215

(51) Int. Cl.
*G01R 33/54* (2006.01)
*G01R 33/561* (2006.01)
*G01R 33/56* (2006.01)

(52) U.S. Cl.
CPC ............ *G01R 33/54* (2013.01); *G01R 33/5617* (2013.01); *G01R 33/5602* (2013.01)

(58) Field of Classification Search
CPC ..... G01R 33/561; G01R 33/56; G01R 33/565; G01R 33/54; G01R 33/4833
USPC .......................................................... 324/309
See application file for complete search history.

(56) References Cited

U.S. PATENT DOCUMENTS 4,748,409 A * 5/1988 Frahm et al. ................... 324/309
5,270,654 A * 12/1993 Feinberg et al. .............. 324/309

(Continued)

FOREIGN PATENT DOCUMENTS

CN   101653360 A   2/2010
JP   7-323016   12/1995

OTHER PUBLICATIONS

Bernd Kuhn, Wolfgang Dreher, David G. Norris, Dieter Leibfritz; Fast Proton Spectroscopic Imaging Employing k-Space Weighting Achieved by Variable Repetition Times; Copyright (C) 1996 by Williams & Wilkins; pp. 457-464.*

(Continued)

*Primary Examiner* — Jermele M Hollington
*Assistant Examiner* — Christopher McAndrew
(74) *Attorney, Agent, or Firm* — Nixon & Vanderhye P.C.

(57) ABSTRACT

According to one embodiment, a magnetic resonance imaging apparatus includes a data acquiring unit and an image generating unit. The data acquiring unit is configured to acquire a signal train of magnetic resonance signals from an object by a spin echo method for applying a refocus pulse repeatedly following an excitation pulse with changing a flip angle of the refocus pulse. The image generating unit is configured to generate frames of image data having different contrasts, based on different portions of the signal train of the magnetic resonance signals.

8 Claims, 4 Drawing Sheets

(56) References Cited

U.S. PATENT DOCUMENTS

| | | | |
|---|---|---|---|
| 5,317,264 A * | 5/1994 | Rommel et al. | 324/309 |
| 5,334,936 A * | 8/1994 | Machida | 324/309 |
| 5,545,992 A * | 8/1996 | Foo | 324/309 |
| 5,704,357 A | 1/1998 | Miyazaki et al. | |
| 5,842,989 A * | 12/1998 | Zur | 600/410 |
| 6,025,714 A | 2/2000 | Avram et al. | |
| 6,078,176 A * | 6/2000 | McKinnon | 324/309 |
| 6,291,996 B1 * | 9/2001 | Glover et al. | 324/309 |
| 6,369,568 B1 | 4/2002 | Ma et al. | |
| 6,690,961 B1 * | 2/2004 | Kaufman et al. | 600/410 |
| 7,227,356 B1 * | 6/2007 | Hariharan et al. | 324/307 |
| 7,254,437 B2 * | 8/2007 | Miyazaki | 600/410 |
| 7,570,051 B2 * | 8/2009 | Haider | 324/309 |
| 7,705,597 B2 * | 4/2010 | Horger et al. | 324/309 |
| 2002/0188190 A1 * | 12/2002 | Kassai et al. | 600/410 |
| 2004/0059213 A1 * | 3/2004 | Kassai et al. | 600/410 |
| 2005/0001617 A1 | 1/2005 | Busse | |
| 2005/0033151 A1 * | 2/2005 | Wu et al. | 600/410 |
| 2007/0161890 A1 * | 7/2007 | Hariharan et al. | 600/410 |
| 2007/0249929 A1 * | 10/2007 | Jeong et al. | 600/410 |
| 2008/0081986 A1 * | 4/2008 | Slavin | 600/410 |
| 2008/0136411 A1 * | 6/2008 | Miyoshi | 324/309 |
| 2008/0197846 A1 * | 8/2008 | Hoogeveen et al. | 324/309 |
| 2008/0278159 A1 * | 11/2008 | Park | 324/307 |
| 2009/0033326 A1 * | 2/2009 | Szyperski et al. | 324/307 |
| 2009/0124885 A1 * | 5/2009 | Umeda et al. | 600/410 |
| 2009/0182222 A1 * | 7/2009 | Machida et al. | 600/410 |
| 2009/0267604 A1 * | 10/2009 | Umeda | 324/309 |
| 2010/0052675 A1 * | 3/2010 | Priatna et al. | 324/309 |
| 2010/0308819 A1 * | 12/2010 | Umeda et al. | 324/307 |
| 2011/0046475 A1 * | 2/2011 | Assif et al. | 600/422 |
| 2011/0101980 A1 * | 5/2011 | Ohiwa et al. | 324/309 |
| 2011/0115484 A1 * | 5/2011 | Lee et al. | 324/309 |
| 2011/0121829 A1 * | 5/2011 | Umeda et al. | 324/309 |
| 2011/0181282 A1 * | 7/2011 | Dannels | 324/309 |

OTHER PUBLICATIONS

H. Jara, F. W. Wehrli, H. Chung, J. C. Ford; High-Resolution Variable Flip Angle 3D MR Imaging of Trabecular Microstructure in Vivo; Copyright © 1993 by Williams & Wilkins; pp. 528-539.*

Yasvir A. Tesiram, Frances Separovic; Matrix Method for Analysis of Selective NMR Pulses; Concepts in Magnetic Resonance Part A. vol. 25A(I) 1-17 (2005), Published online in Wiley InterScience, e 2005 Wiley Periodicals. Inc. p. 1-17.*

Jung-Ah ChOi, MD, PhD and Garry Gold, MD; MR Imaging of Articular Cartilage Physiology; Magn Reson Imaging Clin N Am. May 2011; 19(2);249-282.*

Non-English Written Opinion for PCT/JP2012/069920 mailed Oct. 9, 2012.

International Search Report for PCT/JP2012/069920 mailed Oct. 9, 2012.

Notification of Transmittal of Translation of the International Preliminary Report on Patentability in PCT/JP2012/069920 mailed Apr. 3, 2014.

* cited by examiner

MAGNETIC RESONANCE IMAGING APPARATUS AND MAGNETIC RESONANCE IMAGING METHOD

CROSS REFERENCES TO RELATED APPLICATIONS

This is a continuation of Application PCT/JP2012/69920, filed Aug. 3, 2012.

This application is based upon and claims the benefit of priority from Japanese Patent Application No. 2011-208215, filed Sep. 22, 2011; the entire contents of which are incorporated herein by reference.

FIELD

Embodiments described herein relate generally to a magnetic resonance imaging (MRI) apparatus and a magnetic resonance imaging method.

BACKGROUND

MRI is an imaging method which magnetically excites nuclear spin of an object set in a static magnetic field with a RF (radio frequency) signal having the Larmor frequency and reconstructs an image based on MR (magnetic resonance) signals generated due to the excitation.

As one of imaging methods for MRI, VFA (variable flip angle) method is known. The VFA method aims at the reduction of blurring resulting from the attenuation of signals by the transverse relaxation (T2 relaxation) and the reduction of SAR (specific absorption rate). For that purpose, the VFA is an imaging method for acquiring MR signals by an FSE (fast spin echo) sequence with a varying FA (flip angle) of the refocus pulses.

Prior Technical Literature

[Patent literature 1] JPA H07-323016

The VFA method is mainly applied in a 3D (three dimensional) MRI sequence. Moreover, in the VFA method, MR image data having isotropic pixels are acquired, and an observation of an image in an arbitrary section is performed by MPR (multi planar reconstruction) processing. Therefore, in imaging by the VFA method, the number of slices is generally many and there is a tendency for imaging time to become long.

In addition, a sweep pattern of FA in the VFA method is designed so that attenuation of the signals from a specific metabolite may decrease. For this reason, in case of acquiring images of which contrasts differ, imagings by MRI sequences having sweep patterns of FA respectively corresponding to the different contrasts are needed. Therefore, in case of acquiring images of which contrasts differ, imaging time becomes longer. For example, though MR images having different contrasts are generally acquired in case of imaging a joint, there is a problem that imaging time becomes long when imaging is performed by the VFA method.

Accordingly, it is an object of the present invention to provide a magnetic resonance imaging apparatus and a magnetic resonance imaging method which can acquire MR images, of which contrasts differ, with appropriate image qualities, in a shorter imaging time, using the VFA method for acquiring MR signals with varying FA.

DETAILED DESCRIPTION OF EXEMPLARY EMBODIMENTS

In general, according to one embodiment, a magnetic resonance imaging apparatus includes a data acquiring unit and an image generating unit. The data acquiring unit is configured to acquire a signal train of magnetic resonance signals from an object by a spin echo method applying a refocus pulse repeatedly following an excitation pulse with a changing flip angle of the refocus pulses. The image generating unit is configured to generate frames of image data having different contrasts, based on different portions of the signal train of the magnetic resonance signals.

Further, according to another embodiment, a magnetic resonance imaging apparatus includes a data acquiring unit and an image generating unit. The data acquiring unit is configured to acquire a signal train of magnetic resonance signals from an object by a spin echo method applying a refocus pulse repeatedly following an excitation pulse with a changing flip angle of the refocus pulse, along a sweep pattern representing a change of the flip angle appropriate for different contrasts. The image generating unit is configured to generate frames of image data having the different contrasts, based on different portions of the signal train of the magnetic resonance signals.

Further, according to another embodiment, a magnetic resonance imaging method includes: acquiring a signal train of magnetic resonance signals from an object by a spin echo method applying a refocus pulse repeatedly following an excitation pulse with a changing flip angle of the refocus pulses; and generating frames of image data having different contrasts, based on different portions of the signal train of the magnetic resonance signals.

A magnetic resonance imaging apparatus and a magnetic resonance imaging method according to embodiments of the present invention will be described with reference to the accompanying drawings.

Figure 1:
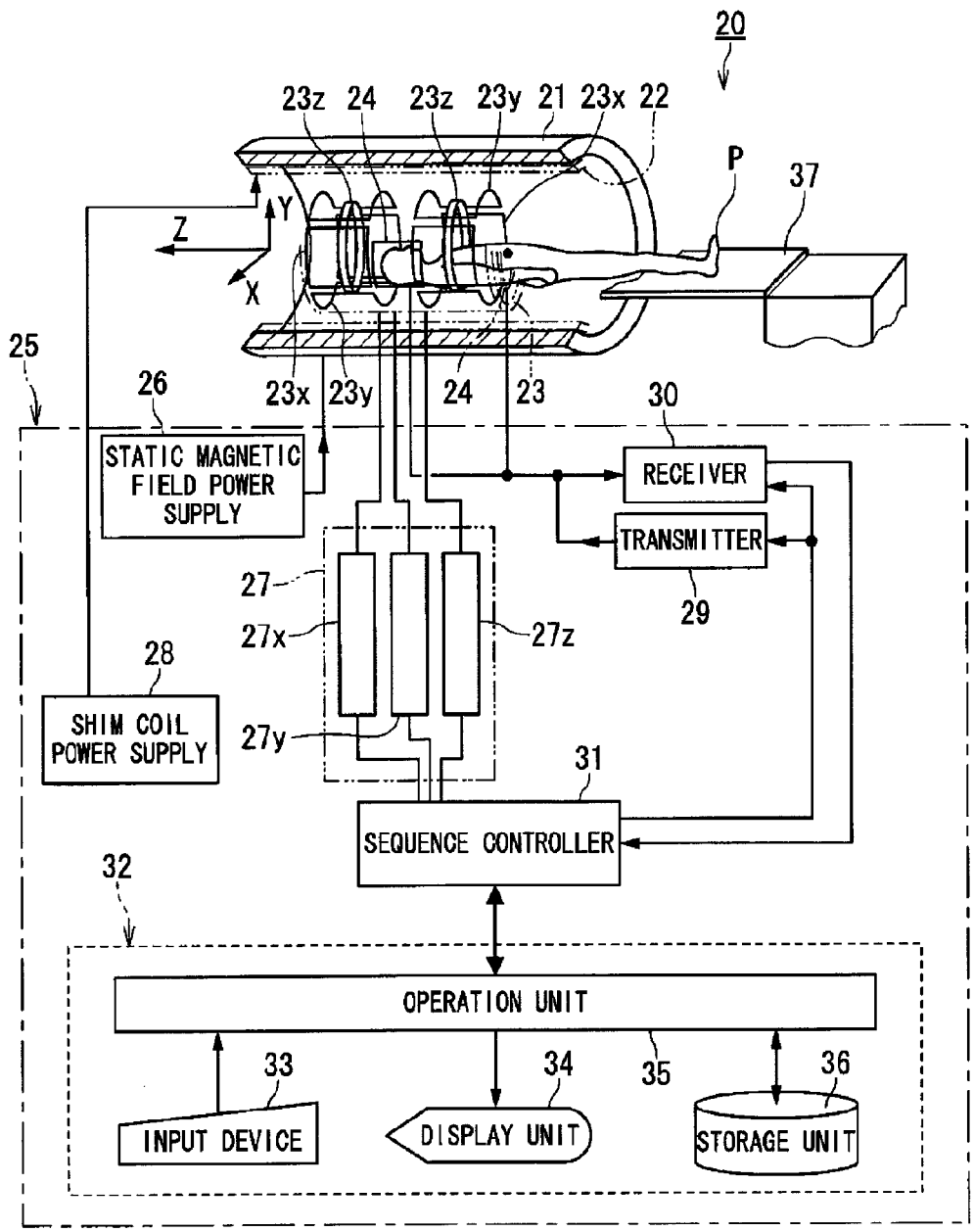
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. The RF coils 24 include a whole body coil (WBC: whole body coil), which is built in the gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 transmits an RF signal given from the transmitter 29 to the object P. The reception RF coil 24 receives MR signals generated due to a nuclear spin inside the object P which is excited by the RF signal to give to the receiver 30.

The sequence controller 31 of the control system 25 communicates with the gradient power supply 27, the transmitter 29 and the receiver 30. The sequence controller 31 stores sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined stored sequence. The control information above-described includes motion control information, such as intensity, impression period and impression timing of the electric current pulse which should be applied by the gradient power supply 27.

The sequence controller 31 is also configured to give raw data to the computer 32. The raw data is complex-valued data obtained through the detection of a MR signal and A/D (analog to digital) conversion to the MR signal detected in the receiver 30.

The transmitter 29 gives an RF signal to the RF coil 24 in accordance with control information provided from the sequence controller 31. The receiver 30 generates raw data which is digitized complex-valued numerical data by detecting a MR signal given from the RF coil 24 and performing predetermined signal processing and A/D converting to the MR signal detected. The receiver 30 also gives the generated raw data to the sequence controller 31.

The computer 32 is configured for various functions by the operation unit 35 executing some programs stored in the storage unit 36 of the computer 32. Alternatively, some specific circuits having various functions may be provided with the magnetic resonance imaging apparatus 20 instead of using some of the computer programs.

Figure 2:
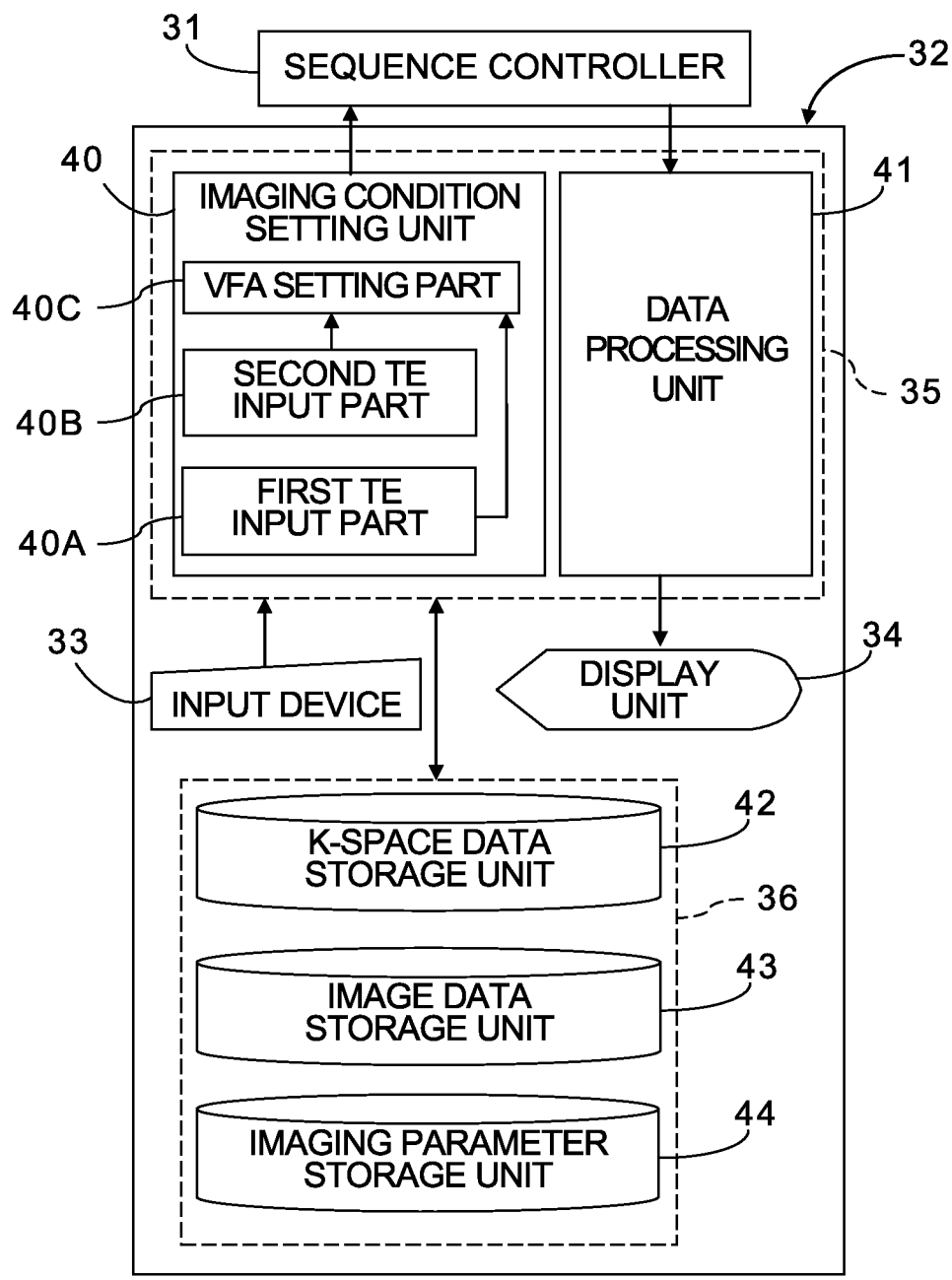
FIG. 2 is a functional block diagram of the computer shown in FIG. 1.

FIG. 2 is a functional block diagram of the computer 32 shown in FIG. 1.

The operation unit 35 of the computer 32 functions as an imaging condition setting unit 40 and a data processing part 41 by executing programs stored in storage unit 36. The imaging condition setting unit 40 has the first TE (echo time) input part 40A, the second TE input part 40B, and a VFA setting part 40C. Moreover, the storage unit 36 functions as a k-space data storage part 42, an image data storage part 43, and an imaging parameter storage part 44.

The imaging condition setting unit 40 has a function to set imaging conditions including a pulse sequence by the VFA method based on direction information from the input device 33 and output the set imaging conditions to the sequence controller 31. The VFA method is an imaging method for imaging using an FSE sequence in which RF refocus pulses having non-constant FAs are repeatedly applied following an RF excitation pulse. In other words, the VFA method is an imaging method using an SE (spin echo) method for acquiring a signal train consisting of MR signals from the object P by applying a refocus pulse repeatedly with a changing FA following an excitation pulse. By the VFA method, MR data are typically acquired using a 3D-FSE sequence.

Especially the imaging condition setting unit 40 has a function to set imaging conditions for acquiring frames of MR image data having different contrasts by one scan using a common FSE sequence. For that purpose, the imaging condition setting unit 40 is configured to set appropriate FAs variably according to contrasts of respective frames of image data. Specifically, imaging conditions by an SE method for applying a refocus pulse repeatedly after an excitation pulse with changing FA along a sweep pattern representing an appropriate change of FA for contrasts are set up in the imaging condition setting unit 40. In other words, the imaging condition setting unit 40 has a function to set FAs appropriate to TEs corresponding to frames of image data having different contrasts.

More specifically, frames of image data having different contrasts can be generated based on an MR echo signal train acquired by an FSE sequence by distributing the MR echo signal train into signal train portions to assign the signal train portions to the different frames of image data respectively. The sets consisting of the MR signal trains grouped for the frames of image data may be overlapped or not be overlapped. Moreover, a certain set of MR signal train(s) may be included in another MR signal train.

Furthermore, by adjusting FAs of refocus pulses applied at timings corresponding to relaxation times, such as longitudinal relaxation times (T1s), transverse relaxation times (T2s), or Tips, of metabolites, such as cerebral tissue, to be enhanced, frames of image data, having different contrasts, in which the respective metabolites have been enhanced can be obtained. For example, in case of acquiring frames of image data which have contrasts adjusted for two kinds of metabolites, what is necessary is to adjust the sweep pattern representing a time change of FA in the former refocus pulses so that intensities of MR echo signals from the metabolite showing the shorter relaxation time become sufficient and the sweep pattern of FA in the latter refocus pulses so that intensities of MR echo signals from the metabolite showing the longer relaxation time become sufficient.

Note that, not only the relaxation time, such as a T1, a T2, or a T1ρ, for each metabolite and a TE which determine timings for applying refocus pulses but further adjusting other parameters influencing contrasts also makes it possible to acquire frames of image data having desired contrasts. Typical other parameters for adjusting contrasts include whether prepulses, such as an IR (inversion recovery) prepulse or a saturation pulse, are applied, kinds and the number of prepulses, TIs (inversion times) of IR prepulses, and a TR (repetition time). In case of adjusting these parameters, the sweep pattern of FA is also adjusted so as to be an appropriate curve according to the adjusted parameters.

Hereinafter, a case where frames of MR image data having two kinds of contrasts are acquired will be described for example.

The first TE input part 40A of the imaging condition setting unit 40 has a function to input the first TE, appropriate to acquire image data having a contrast adjusted to the first metabolite, from the input device 33 and supply the input first TE to the VFA setting part 40C. The second TE input part 40B has a function to input the second TE, appropriate to acquire image data having a contrast adjusted to the second metabolite, from the input device 33 and to supply the input first TE to the VFA setting part 40C.

Note that, the first TE input part 40A and the second TE input part 40B may be configured to set timings, at which intensities of MR echo signals become appropriate, to the first and second TEs based on relaxation times which are known physical values for respective metabolites and give the set first and second TEs to the VFA setting part 40C when information specifying the first metabolite and information specifying the second metabolite have been input into the first TE input part 40A and the second TE input part 40B respectively instead of the first TE and the second TE from the input device 33.

The VFA setting part 40C has a function to set a sweep pattern of FA for acquiring both image data having the first contrast and image data having the second contrast with appropriate image qualities by one imaging scan using a FSE sequence, based on the first TE acquired from the first TE input part 40A, the second TE acquired from the second TE input part 40B, and the relaxation times of the respective metabolites.

Specifically, a sweep pattern of FA for obtaining the first and second contrasts satisfactorily can be calculated automatically by the optimization calculation of the sweep pattern of FA so that each intensity of an echo signal train including echo signals acquired at the first TE become appropriate and each intensity of an echo signal train including echo signals acquired at the second TE also become appropriate. Note that, in order to calculate a sweep pattern of FA for obtaining predetermined signal intensities, an arbitrary known method can be used.

Therefore, when a user sets up two TEs corresponding to relaxation times of two metabolites by operation of the input device 33, an appropriate sweep pattern of FA for the two TEs is automatically set for a VFA-FSE sequence by the calculation in the VFA setting part 40C. However, two TEs may be related to an appropriate sweep pattern of FA beforehand to be put in a database.

In the imaging parameter storage part 44, a table or a function which relates two TEs with an appropriate sweep pattern of FA is stored. When a table is stored, a range of the first TE and a range of the second TE can be related with an appropriate sweep pattern of FA, for example. Therefore, the sweep pattern of FA is to vary intermittently along the change of the first TE and the second TE. On the other hand, when a function is stored, the sweep pattern of FA is specified according to values of the first TE and the second TE.

Note that, in case of generating three or more frames of image data from a common MR signal train, a sweep pattern representing an appropriate variation of FA is stored, for each combination of TEs corresponding to the frames of the image data, in the imaging parameter storage part 44.

Then, the VFA setting part 40C is configured to acquire a sweep pattern of FA corresponding to the first TE acquired from the first TE input part 40A and the second TE acquired from the second TE input part 40B with reference to the imaging parameter storage part 44. Moreover, in case of generating three or more frames of image data, the VFA setting part 40C is configured to acquire a sweep pattern of FA related with TEs corresponding to the frames of the image data, from the imaging parameter storage part 44.

Figure 3:
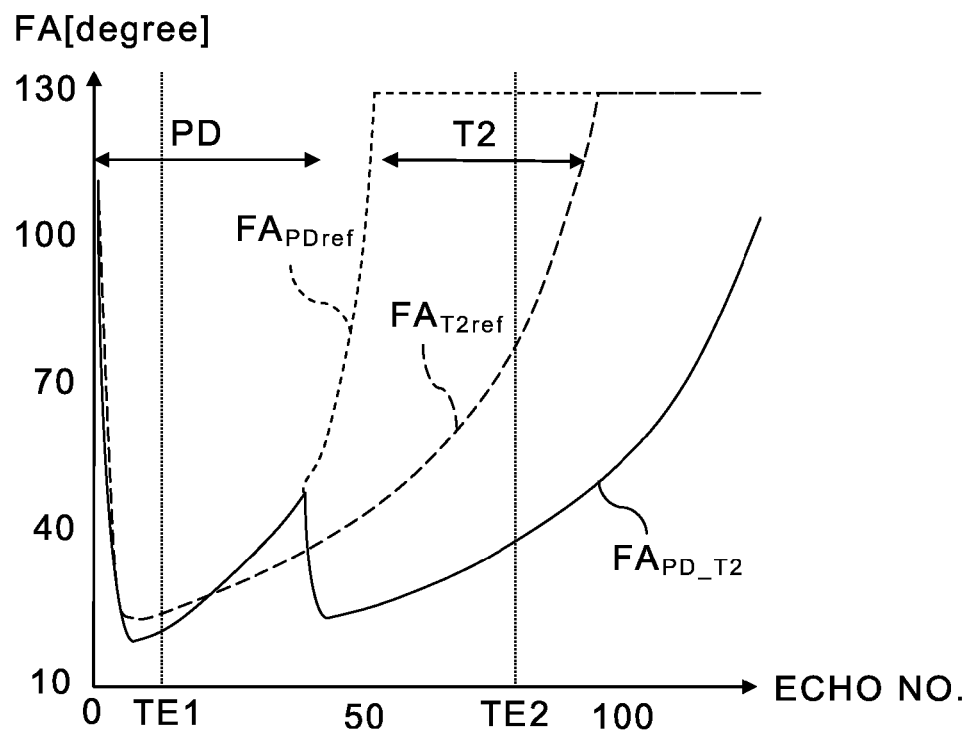
FIG. 3 is a graph which shows an example of a sweep pattern of FA set up in the VFA setting part shown in FIG. 2.

FIG. 3 is a graph which shows an example of sweep pattern of FA set up in the VFA setting part 40C shown in FIG. 2.

In FIG. 3, the horizontal axis represents the echo number showing the acquisition order of each echo signal, and the vertical axis represents a FA of a refocus pulse applied repeatedly, in order to acquire the echo signal train.

The solid line in FIG. 3 represents a sweep pattern ($FA_{PD\_T2}$) of FA for acquiring both PD (proton density) image data and T2 weighted image data of a joint, as frames of image data which have the first and second contrasts. Moreover, in FIG. 3, the dotted line represents the conventional sweep pattern ($FA_{PDref}$) of FA for acquiring only PD image data and the dashed line represents the conventional sweep pattern ($FA_{T2ref}$) of FA for acquiring only T2 weighted image data, for references, respectively.

The T1 value for obtaining the PD image data is about $800 \times 10^{-3}$ [s], and the T1ρ value is about $80 \times 10^{-3}$ [s]. Therefore, the first TE (TE1) of the echo signal train for the generation of the PD image data can be set as about $50 \times 10^{-3}$ [s]. If an ETS (echo train space) of the echo signal train is $5 \times 10^{-3}$ [s], it is the tenth echo signal that is acquired at the timing after $50 \times 10^{-3}$ [s] from applying the excitation pulse. Therefore, the conventional sweep pattern ($FA_{PDref}$) of the FA for acquiring only the PD image data has been adjusted as shown by the dotted line so that the echo signal train, including the tenth echo signal, from the protons are acquired with equivalent intensities.

On the other hand, the T1 value and the T1ρ value for obtaining the T2 weighted image data are set longer than those for obtaining the PD image data. For that purpose, the second TE (TE2) longer than the first TE is set to the generation of the T2 weighted image data. If the second TE is about $400 \times 10^{-3}$ [s] for example, it is the eightieth echo signal that is acquired at the timing corresponding to the second TE. Therefore, the conventional sweep pattern ($FA_{T2ref}$) of the FA for acquiring only the T2 weighted image data has been adjusted as shown by the dashed line so that the echo signal train, including the eightieth echo signal, from the metabolite to be enhanced are acquired with equivalent intensities.

Furthermore, in case of acquiring an echo signal train for both the PD image data and the T2 weighted image data, it is necessary to use a part of the echo signal train as the first echo signal train for the PD image data and the other part of the echo signal train as the second echo signal train for the T2 weighted image data.

In case of acquiring the PD image data and the T2 weighted image data respectively with the first TE and the second TE as shown in FIG. 3, a 40 echo signal train including the echo signals acquired at the timings of the first TE and the second TE respectively can be assigned to the PD image data and the T2 weighted image data. That is, the echo signal train which consists of the first echo signal up to the 40 th echo signal can be set as the first echo signal train for the PD image data. On the other hand, the echo signal train which consists of the 51 st echo signal up to the 90 th echo signal can be set as the second echo signal train for the T2 weighted image data.

Therefore, with regard to the sweep pattern of FA, what is necessary is just to tune up the FAs corresponding to the first echo signal up to the 40 th echo signal according to the intensities of the first echo signal train from the protons for the PD image data and tune up the FAs corresponding to the 41 st and the subsequent echo signals according to the intensities of the second echo signal train from the metabolite to be enhanced for the T2 weighted image data. As a result, the sweep pattern ($FA_{PD\_T2}$) of FA as shown by the solid line of FIG. 3 is obtained.

That is, the sweep pattern ($FA_{PD\_T2}$) of FA is optimized to be appropriate for both the first TE and the second TE so that echo signals from two different substances may have sufficient intensities and become flat temporally. For this reason, the sweep pattern ($FA_{PD\_T2}$) of FA becomes a discontinuous curve which has the two local minimal values as shown in FIG. 3.

Note that, the numbers of the echo signals assigned to the PD image data and the T2 weighted image data can also be adjusted according to an imaging purpose of the PD image data and the T2 weighted image data or the like. For example, the 40 echo signals from the first to the 40 th may be assigned to the PD image data while the 60 echo signals from the 41 st to the 100 th may be assigned to the T2 weighted image data.

Thus, the former of the sweep pattern of FA can be designed for the PD image data and the latter can be designed for the T2 weighted image data. Similarly, in case of acquiring other frames of image data having two or more mutually different contrasts, the sweep pattern of FA can be designed by dividing into portions for the respective frames of the image data. In case of acquiring three or more frames of image data, the sweep pattern of FA becomes a curve showing local minimal values of which the number is according to the number of the frames of the image data.

Note that, echo signal trains corresponding to different frames of image data may overlap or a certain echo signal train may include another echo signal train, as mentioned above, depending on intervals between TEs and the number of echo signals required for generation of frames of image data. Therefore, a common portion of the sweep pattern of FA may be also designed corresponding to frames of image data.

Figure 4:
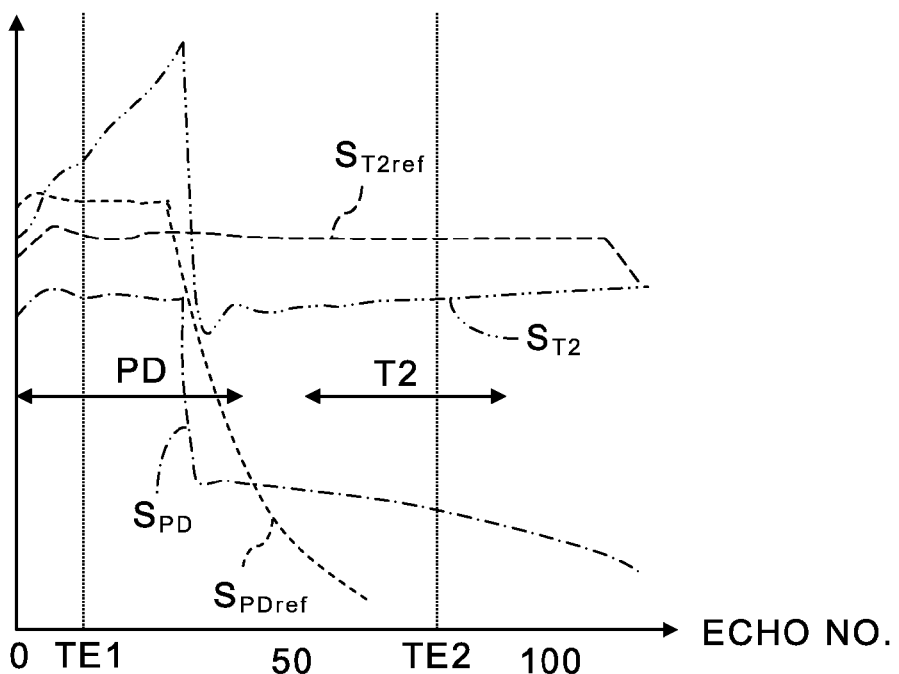
FIG. 4 is a graph which shows the intensities of MR signals acquired corresponding to the FAs shown in FIG. 3.

FIG. 4 is a graph which shows the intensities of MR signals acquired corresponding to the FAs shown in FIG. 3.

In FIG. 4, the horizontal axis represents the echo number showing the acquisition order of each echo signal, and the vertical axis represents each relative signal intensity of echo signal.

In FIG. 4, the dashed-dotted line is a curve ($S_{PD}$), showing the relative signal intensities of the echo signals from the metabolite to be depicted in the PD image data, acquired corresponding to the sweep pattern ($FA_{PD\_T2}$) of FA for acquiring both the PD image data and the T2 weighted image data, and the dashed-two dotted line is a curve ($S_{T2}$) showing the relative signal intensities of the echo signals from the metabolite to be a target of the T2 weighting. Moreover, in FIG. 4, the dotted line is a curve ($S_{PDref}$), for reference, showing the relative signal intensities of the echo signals corresponding to the conventional sweep pattern ($FA_{PDref}$) of FA for acquiring only the PD image data, and the dashed line is a curve ($S_{T2ref}$), for reference, showing the relative signal intensities of the echo signals corresponding to the conventional sweep pattern ($FA_{T2ref}$) of FA for acquiring only the T2 weighted image data.

According to FIG. 4, it can be seen that the echo signals for the PD image can be acquired with stable intensities and a small fluctuation in the first acquisition period of the echo signal train including the first TE by the sweep pattern ($FA_{PD\_T2}$) of FA shown in FIG. 3. Similarly, it can be seen that the echo signals from the metabolite which is the target of T2 weighting can be acquired with stable intensities in the second acquisition period of the echo signal train including the second TE.

Therefore, it becomes possible to generate the PD image data, with an improved image quality, from the 40 echo signals acquired in the first acquisition period of the echo signal train including the first TE and the T2 weighted image data, with an improved image quality, from 40 echo signals acquired in the second acquisition period of the echo signal train including the second TE.

In the imaging condition setting unit 40, an FSE sequence for generating frames of image data having different contrasts, like PD image data and T2 weighted image data, with improved image qualities in this way is set up. For example, in case of acquiring an echo signal train under the VFA condition shown in FIG. 3 and FIG. 4, what is necessary is just to set up the FSE sequence for applying PE (phase encode) gradient field step pulses, having relative intensities from −20 to 19, in order to acquire the echo signals from the first up to the 40 th, no PE gradient field step pulses corresponding to the echo signals from the 41 st to the 50 th, and PE gradient field step pulses, having relative intensities from −20 to 19, in order to acquire the echo signals from the 51 st to the 90 th. That is, PE gradient field pulses are to be applied repeatedly with the same intensities the number of times corresponding to the number of contrasts.

The data processing part 41 has a function to obtain MR signals, acquired by an imaging scan under the imaging conditions set up in the imaging condition setting unit 40, from the sequence controller 31 to arrange the obtained MR signals in a k-space formed in the k-space data storage part 42; a function to take k-space data from the k-space data storage part 42 to reconstruct image data by image reconstruction processing including a FT (Fourier transform); a function to write the image data, obtained by the reconstruction, in the image data storage part 43; and a function to apply required image processing of image data taken from the image data storage part 43 to display the image data on the display unit 34.

Especially, the data processing part 41 is configured to arrange echo signal trains, acquired for a generation of frames of image data having different contrasts, in the k-spaces corresponding to the respective frames of the image data to generate the frames of the image data having the different contrasts by image reconstruction processing of the pieces of k-space data. In other words, the data processing part 41 has a function to generate frames of image data, having different contrasts, based on different portions of a signal train of MR signals.

Next, an operation and an action of the magnetic resonance imaging apparatus 20 will be described. Here, an example case of acquiring PD image data and T2 weighted image data by an imaging of the object P will be described.

Figure 5:
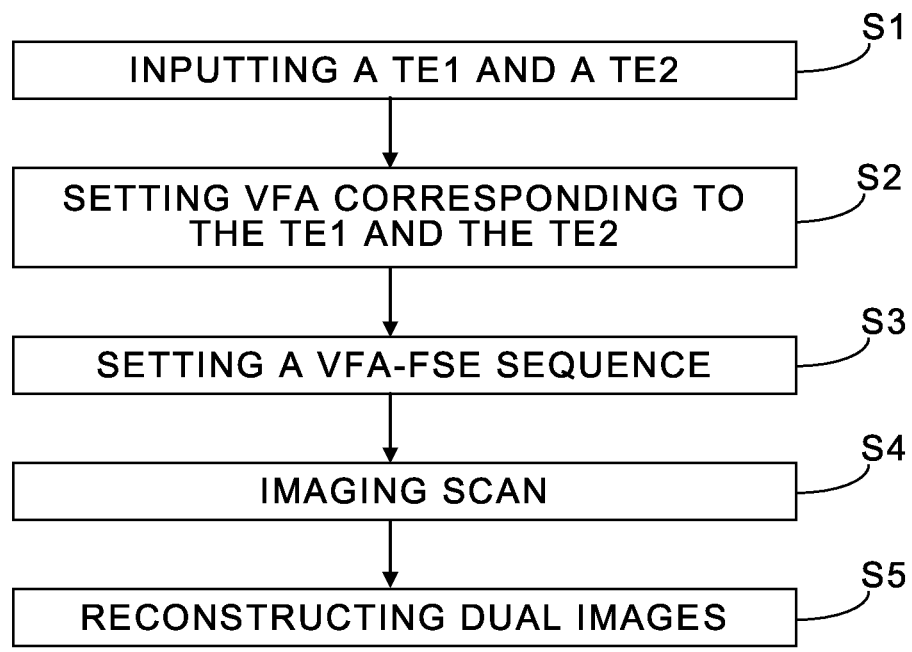
FIG. 5 is a flow chart which shows a process flow for acquiring MR images, having different contrasts, by the VFA method in the magnetic resonance imaging apparatus shown in FIG. 1.

FIG. 5 is a flow chart which shows a flow for acquiring MR images, having mutually different contrasts, by the VFA method in the magnetic resonance imaging apparatus 20 shown in FIG. 1.

First, In step S1, information specifying the protons and a metabolite as a target for the T2 weighting or the first TE (TE1) and the second TE (TE2) corresponding to these substances are input into the imaging condition setting unit 40 by operation of the input device 33 through the setting screen of imaging conditions displayed on the display unit 34.

Specifically, the information specifying the protons or the first TE (TE1) appropriate for the PD image data is input into the first TE input part 40A. Then, the first TE input part 40A gives the first TE appropriate for the PD image data to the VFA setting part 40C. On the other hand, the information specifying the metabolite as the target for the T2 weighting or the second TE appropriate for the T2 weighted image data is input into the second TE input part 40B. Then, the second TE input part 40B gives the second TE appropriate for the T2 weighted image data to the VFA setting part 40C.

Next, in step S2, the VFA setting part 40C sets the sweep pattern ($FA_{PD\_T2}$) of FA corresponding to the first TE (TE1) and the second TE (TE2) in the VFA-FSE sequence as a VFA condition. Specifically, the VFA setting part 40C calculates the sweep pattern ($FA_{PD\_T2}$) representing a change of FA so as to acquire the portion of the echo signal train for the PD image data with stable intensities in the first acquisition period of echo signal train including the first TE and acquire the portion of the echo signal train for the T2 weighted image data with stable intensities in the second acquisition period of echo signal train including the second TE. Alternatively, the VFA setting part 40C refers to the imaging parameter storage part 44 to acquire the appropriate sweep pattern ($FA_{PD\_T2}$) of FA corresponding to the first TE and the second TE from the imaging parameter storage part 44.

Next, in step S3, the imaging condition setting unit 40 sets imaging conditions including a VFA-FSE sequence which has the sweep pattern ($FA_{PD\_T2}$) of FA set in the VFA setting part 40C.

Next, in step S4, an imaging scan is performed according to the imaging conditions set by the imaging condition setting unit 40. That is, the components for a data acquisition of MR signals, such as the gradient coil 23 and the RF coil 24, which constitute the magnetic resonance imaging apparatus 20, acquire a signal train of MR signals from the object P according to the VFA-FSE sequence.

For that purpose, the object P is set to the bed 37 beforehand, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Then, the input device 33 sends instruction of starting a scan to the imaging condition setting unit 40. Therefore, the imaging condition setting unit 40 outputs the imaging conditions including the VFA-FSE sequence to the sequence controller 31. The sequence controller 31 drives the gradient power supply 27, the transmitter 29, and the receiver 30 in accordance with the pulse sequence, thereby generating a gradient magnetic field at the imaging area having the set object P, and further generating RF signals from the RF coil 24.

At this time, the refocus pulse of the VFA-FSE sequence is repeatedly applied to the imaging part of the object P with an appropriate FA for both the first TE and the second TE corresponding to the PD image data and the T2 weighted image data.

Consequently, the RF coil 24 receives MR signals generated due to the nuclear magnetic resonance in the object P. Then, the receiver 30 receives the MR signals from the RF coil 24 and generates raw data, which are digital data of the MR signals, by A/D (analog to digital) conversion subsequently to predetermined signal processing of the MR signals. The receiver 30 supplies the generated raw data to the sequence controller 31. The sequence controller 31 supplies the raw data to the data processing part 41. The data processing part 41 arranges the raw data as k-space data to the k-space formed in the k-space data storage part 42.

Note that, the first echo signal train acquired corresponding to the first TE, out of the echo signal train acquired by the data processing part 41 are the signals for the PD image data, and the second echo signal train acquired corresponding to the second TE are the signals for the T2 weighted image data. Therefore, the first echo signal train is arranged in the first k-space for the PD image data. On the other hand, the second echo signal train is arranged in the second k-space for the T2 weighted image data.

Next, in step S5, the data processing part 41 generates the PD image data by the image reconstruction processing of the first k-space data acquired from the first k-space. On the other hand, the data processing part 41 generates the T2 weighted image data by the image reconstruction processing of the second k-space data acquired from the second k-space.

Each of the PD image data and the T2 weighted image data, generated in this way, have been obtained with applying the sweep pattern ($FA_{PD\_T2}$) of FA for acquiring the echo signals with stable intensities. In addition, the PD image data and the T2 weighted image data have been generated based on the echo signal train acquired by the single VFA-FSE sequence. Therefore, the PD image data and the T2 weighted image data can be generated in a shorter imaging time with keeping improved image qualities.

Furthermore, the generated PD image data and T2 weighted image data can be displayed on the display unit 34 after required image processing in the data processing part 41.

That is, the above mentioned magnetic resonance imaging apparatus 20 is an apparatus configured to able to acquire frames of image data, having different contrasts, by one imaging scan without degrading image qualities, by adjusting the sweep pattern of FA appropriately according to TEs in an MR data acquisition by the VFA-FSE method.

Therefore, according to the magnetic resonance imaging apparatus 20, frames of image data which have different contrasts can be acquired with improved image qualities by the VFA method in a short time.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a data acquiring unit configured to acquire a signal train of magnetic resonance signals from an object by a single scan using a spin echo method repeatedly applying a refocus pulse, with changing flip angles, following an excitation pulse, a first sweep pattern of changing flip angles and a different second sweep pattern of changing flip angles being mixed in the single scan; and
an image generating unit configured to generate first image data corresponding to the first sweep pattern and second image data corresponding to the second sweep pattern, using the signal train acquired by the single scan, the first image data, and the second image data having different contrasts.

2. The magnetic resonance imaging apparatus as in claim 1, wherein:
said data acquiring unit is configured to acquire the signal train with changing flip angles along the first sweep pattern and the second sweep pattern representing a change of the flip angles appropriate for the different contrasts.

3. The magnetic resonance imaging apparatus as in claim 1, wherein:
said data acquiring unit is configured to apply the refocus pulses repeatedly along a discontinuous sweep pattern representing a change of the flip angles appropriate for echo times corresponding to the first image data and the second image data, the discontinuous sweep pattern including the first sweep pattern and the second sweep pattern, the discontinuous sweep pattern having first and second local minimal values respectively corresponding to the first image data and the second image data.

4. The magnetic resonance imaging apparatus as in claim 1, wherein:
said data acquiring unit is configured to apply the refocus pulses repeatedly along a composite sweep pattern representing a change of the flip angles appropriate for echo times corresponding to the first image data and the second image data, the composite sweep pattern including the first sweep pattern and the second sweep pattern.

5. The magnetic resonance imaging apparatus as in claim 4, further comprising:
a storage unit configured to store sweep patterns of flip angles appropriate for different combinations of echo times,
wherein said data acquiring unit is configured to acquire a composite sweep pattern of the flip angles from said storage unit, the composite sweep pattern including the first sweep pattern and the second sweep pattern, the composite sweep pattern being related to echo times respectively corresponding to the first image data and the second image data.

6. The magnetic resonance imaging apparatus as in claim 4, wherein:
said data acquiring unit is configured to calculate a composite sweep pattern of the flip angles for acquiring portions of the signal train of the magnetic resonance signals with stable intensities, the portions being used to generate the first image data and the second image data respectively, the composite sweep pattern including the first sweep pattern and the second sweep pattern.

7. The magnetic resonance imaging apparatus of claim 1, wherein:
said image generating unit is configured to generate proton density image data and transverse relaxation weighted image data as the first image data and the second image data.

8. A magnetic resonance imaging method comprising:
acquiring a signal train of magnetic resonance signals from an object by using a single scan spin echo method repeatedly applying a refocus pulse, with a changing flip angle, following an excitation pulse, a first sweep pattern and a different second sweep pattern being mixed in the single scan; and
generating first image data corresponding to the first sweep pattern and second image data corresponding to the second sweep pattern, using the signal train acquired by the single scan, the first image data and the second image data having different contrasts.

* * * * *